United States Patent
Cadigan et al.

(10) Patent No.: US 9,965,346 B2
(45) Date of Patent: May 8, 2018

(54) HANDLING REPAIRED MEMORY ARRAY ELEMENTS IN A MEMORY OF A COMPUTER SYSTEM

(71) Applicant: International Business Machines Corporation, Armonk, NY (US)

(72) Inventors: David D. Cadigan, Poughkeepsie, NY (US); Charles A. Kilmer, Essex Junction, VT (US); Anil B. Lingambudi, Bangalore (IN); Adam J. McPadden, Underhill, VT (US); Anuwat Saetow, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 106 days.

(21) Appl. No.: 15/096,344

(22) Filed: Apr. 12, 2016

(65) Prior Publication Data

US 2017/0293514 A1   Oct. 12, 2017

(51) Int. Cl.
| | | |
|---|---|---|
| *G11C 29/00* | (2006.01) | |
| *G06F 11/07* | (2006.01) | |
| *G06F 11/10* | (2006.01) | |

(52) U.S. Cl.
CPC ........ *G06F 11/076* (2013.01); *G06F 11/0727* (2013.01); *G06F 11/0793* (2013.01); *G06F 11/1076* (2013.01)

(58) Field of Classification Search
CPC .............. G06F 11/076; G06F 11/0727; G06F 11/0793; G06F 11/1076; G06F 11/2094; G06F 11/073; G06F 2201/81; G06F 11/1012; G06F 11/10; H03M 13/1111; H03M 13/3927; H03M 13/255; H03M 13/3723; H03M 13/15; H04L 1/0057
See application file for complete search history.

(56) References Cited

U.S. PATENT DOCUMENTS

| | | | |
|---|---|---|---|
| 7,600,165 B2 | 10/2009 | Chih | |
| 7,966,518 B2 | 6/2011 | Bosch et al. | |
| 8,441,882 B2 | 5/2013 | Bollu | |
| 2004/0123181 A1 | 6/2004 | Moon et al. | |
| 2013/0135951 A1* | 5/2013 | Ho ......................... | G11C 29/44 365/200 |
| 2015/0242269 A1 | 8/2015 | Pelley et al. | |
| 2016/0041891 A1* | 2/2016 | Malshe ............... | G06F 11/2094 714/704 |

FOREIGN PATENT DOCUMENTS

EP   1394810 A1   3/2004

OTHER PUBLICATIONS

Huang et al., Built-In Redundancy Analysis for Memory Yield Improvement, IEEE Transactions on Reliability, vol. 52, No. 4, Dec. 2003; 14 pages.

* cited by examiner

*Primary Examiner* — Guerrier Merant
(74) *Attorney, Agent, or Firm* — Cantor Colburn LLP

(57) ABSTRACT

An aspect includes identifying a repaired memory array element in a memory array, and identifying memory array elements in the memory array that are adjacent to the repaired memory array element. A group that includes the repaired and adjacent memory array elements is formed and monitored for error conditions. It is determined whether a number of the error conditions exceeds a threshold. A repair action is performed to the memory array based on determining that the number of error conditions exceeds the threshold.

18 Claims, 4 Drawing Sheets

HANDLING REPAIRED MEMORY ARRAY ELEMENTS IN A MEMORY OF A COMPUTER SYSTEM

BACKGROUND

The present invention relates to computer memory systems, and more specifically, to the handling of repaired memory array elements in a memory of a computer memory system.

Memory plays an important role in computer server systems, and maintaining error free operation is often a key differentiation between suppliers of industry standard dual in-line memory module (DIMM) memory. Silicon defects can occur on semiconductors, including memory chips such as dynamic random access memory (DRAM) devices. Memory chips are typically designed to include redundant elements such that a defective memory array element can be replaced by a spare, or redundant, element. Faulty memory array elements can be identified during manufacturing test and also during field operation (e.g., at customer locations), and they can be repaired (fused) during both the DRAM manufacturing process and field operation.

A defect causing a failure may weaken other cells in the memory. In one example, if an identified defect is in the memory array, this may lead to weaker cells on physically adjacent rows or columns in the memory array. In another example, if the defect is in a decoder or other peripheral circuitry, then repairing array elements will not reduce risk of failure, nor improve errors reported for some array addresse. Weakened memory cells are often not detectable during manufacturing tests, however some of them they may degrade with time and fail during field operation.

SUMMARY

Embodiments include a method, system, and computer program product for handling repaired memory elements in a memory of a computer system. A method includes identifying a repaired memory array element in a memory array, and identifying memory array elements in the memory array that are adjacent to the repaired memory array element. A group that includes the repaired and adjacent memory array elements is formed and monitored for error conditions. It is determined whether a number of the error conditions exceeds a threshold. A repair action is performed to the memory array based on determining that the number of error conditions exceeds the threshold.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
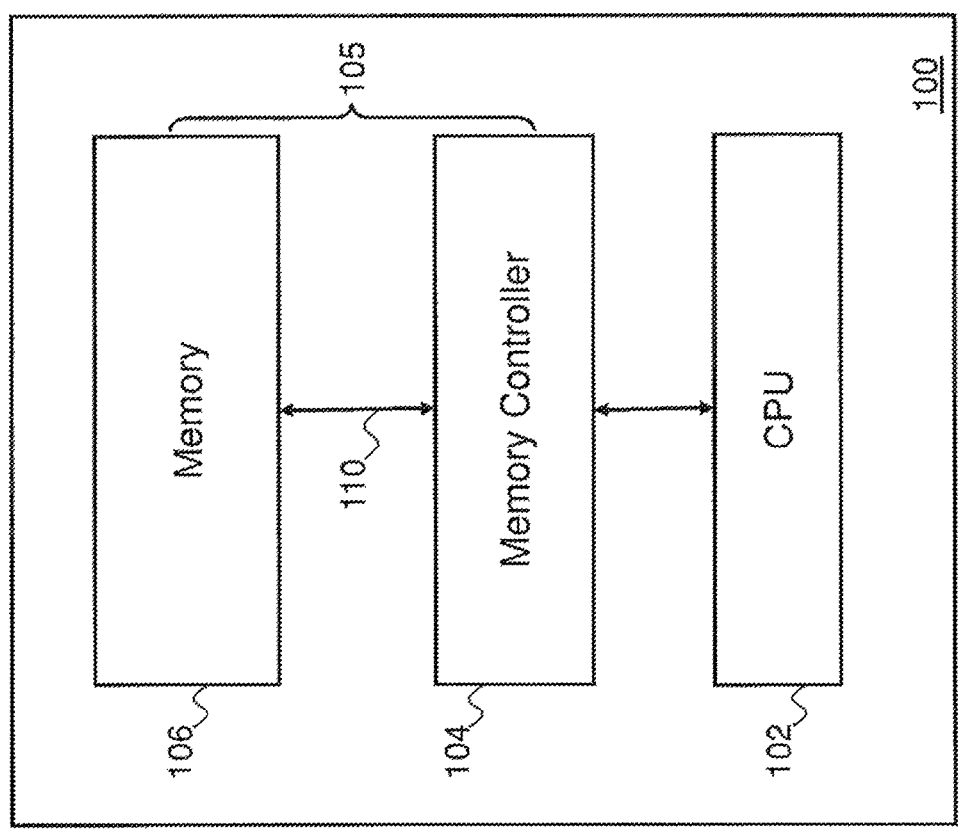
FIG. 1 is a block diagram of an exemplary system according to one or more embodiments of the invention.

Embodiments described herein are directed to proactively monitoring error-correcting code (ECC) activity and/or bit error rates (BERs) for repaired memory array elements and for memory array elements that are adjacent to the repaired memory array elements. In embodiments, the addresses of repaired memory elements and their neighboring memory elements are combined into a group of addresses to be monitored. This group of addresses can be stored, for example, in a multi-purpose register (MPR) or general purpose register (GPR) of a computer system. Specified ECC and/or BER threshold levels can be applied to the memory array elements in the group, with each threshold level having an associated response such as, but not limited to: perform another repair, spare the integrated circuit, or chip, out, etc. This can allow error correction actions to be performed more quickly on those memory array elements that may have a higher probability of failing due to their proximity to a previously repaired memory array element. Embodiments described herein can provide for early warning about and correction of potential critical non-correctable errors.

In an embodiment, a memory includes a memory array that is made up of rows and columns of memory array elements (or cells). The terms "neighboring memory array element" and "adjacent memory array element" are used interchangeably herein to refer to the location of memory elements, or cells, that are proximate to a repaired memory array element. These terms can be used to refer to memory array elements that are physically located one row and one column over in each direction from a repaired element. They can also included memory array elements that are physically located one or more rows and columns over in each direction from a repaired element. For example, if a repaired memory array element is physically located at row 8 column 4 in a memory array, then the adjacent memory array elements can include those located at row 8 columns 3 and 5 and column 4 rows 7 and 9. Alternatively, the adjacent memory array elements can include those located at row 7 columns 3, 4 and 5, row 8 columns 3 and 5, and row 9 columns 3, 4, and 5. Alternatively, the adjacent memory array elements can include those located at row 6 column 4, row 7 columns 3, 4, and 5, row 8 columns 2, 3, 5, and 7, row 9 columns 3, 4, and 5, and row 10 column 4. In embodiments, the identifying of memory array elements to include in the group of addresses to be monitored can be tailored based on heuristic data, memory technology, and/or criticality of data stored on a memory array.

In accordance with an embodiment, if an address of a repaired memory array element or an adjacent memory array element is identified as having an error rate beyond a specified threshold (e.g., a BER threshold) then an action is taken with regard to the identified address. The action can include a field repair (e.g., fusing) to replace the memory array element at the identified address with a spare memory array element. Alternatively, the action can include sparing out the memory chip containing the memory array and/or setting a flag for a field replaceable unit (FRU) call to replace the spared out memory chip. A further action can include marking a memory space that includes the repaired memory array element as "bad" and no longer accessible by a host processor. This further action can be performed when the memory element has been replaced more than a threshold number of times (e.g., 1, 2, 3) and the error is still detected, as this may indicate that there is an error in upstream logic and/or decode circuitry in the memory system. In an embodiment, the number of repairs to a particular address can be monitored with a counter.

In accordance with an embodiment, if the ECC hits are above a specified threshold on a memory array element physically adjacent to a repaired element, then the adjacent memory array elements are proactively replaced with spare (or redundant) memory array elements (if available).

Embodiments described herein can be implemented on any memory array including, but not limited to those located on main memory DRAM and any level of cache. As used herein, the term DRAM is used to refer to one particular type of memory that may be utilized by embodiments. Other types of memory devices such as, but not limited to: static random access memory (SRAM) and embedded DRAM (EDRAM) may also be utilized by embodiments.

FIG. 1 illustrates a block diagram of a system 100, which is a computer system that supports the handling of repaired memory array elements in a memory in accordance with one or more embodiments. The system 100 depicted in FIG. 1 includes a computer processor 102, memory 106 including multiple memory devices (e.g., DRAMs), and a memory controller 104 for reading and storing data in the memory 106 via an interface 110. Collectively, the memory controller 104 and the memory 106 are referred to as a memory system 105. The computer processor 102 can be a single core or multi-core processor. In one or more embodiments the memory controller 104 is coupled to the computer processor 102 and receives read or write requests from the computer processor 102.

The system 100 is one example of a configuration that may be utilized to perform the processing described herein. Although the system 100 has been depicted with only a memory 106, memory controller 104, and computer processor 102, it will be understood that other embodiments would also operate in other systems including additional elements, e.g., multiple computers processors 102 and multiple levels of memory 106. In an embodiment, the memory 106, memory controller 104, and computer processor 102 are not located within the same computer. For example, the memory 106 and memory controller 104 may be located in one physical location (e.g., on a memory module) while the computer processor 102 is located in another physical location (e.g., the computer processor 102 accesses the memory controller 104 via a network). In addition, portions of the processing described herein may span one or more of the memory 106, memory controller 104, and computer processor 102.

Figure 2:
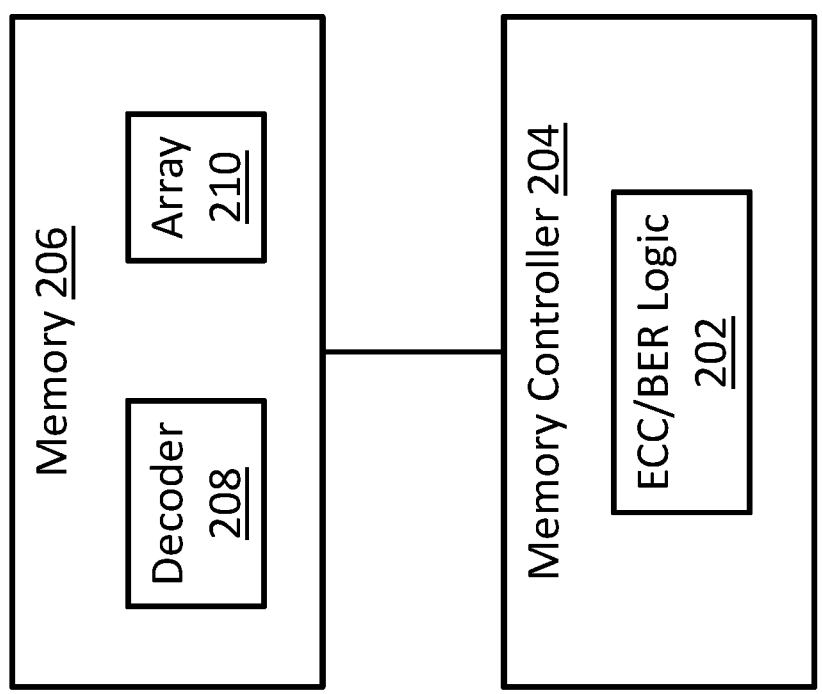
FIG. 2 is a block diagram of a memory and a memory controller according to one or more embodiments of the invention.

Turning now to FIG. 2, a block diagram of a memory 206 and a memory controller 204 in a memory system is generally shown in accordance with one or more embodiments. As shown in FIG. 2, the memory 206 (e.g., a DRAM device) includes a memory array 210 and a decoder 208; and the memory controller 204 includes ECC/BER logic 202 for handling of repaired memory array elements in the memory array 210 as described below in reference to FIG. 4. In an embodiment, the decoder 208 translates logical addresses received from the memory controller 204 into physical addresses in the memory array 210. In the embodiments shown in FIG. 2 where the ECC/BER logic 202 is located in the memory controller 204, the ECC/BER logic 202 monitors the logical addresses that correspond to a repaired array element(s) and those that are physically adjacent to the repaired array element.

Figure 3:
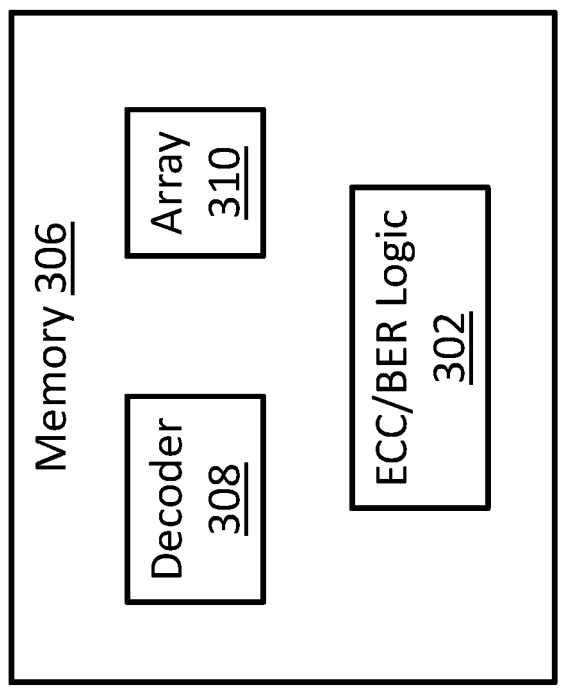
FIG. 3 is a block diagram of a memory according to one or more embodiments of the invention.

Turning now to FIG. 3, a block diagram of a memory 306 in a memory system is generally shown in accordance with one or more embodiments. As shown in FIG. 3, the memory 306 (e.g., a DRAM device) includes a memory array 310, a decoder 308, and ECC/BER logic 308 for handling of repaired memory array elements in the memory array 310 as described below in reference to FIG. 4. In an embodiment, the decoder 308 translates logical addresses received from a memory controller into physical addresses in the memory array 310. In the embodiments shown in FIG. 3 where the ECC/BER logic 302 is located in the memory 306, the ECC/BER logic 302 monitors the addresses that correspond to a repaired array element(s) and those that are physically adjacent to the repaired array element.

Figure 4:
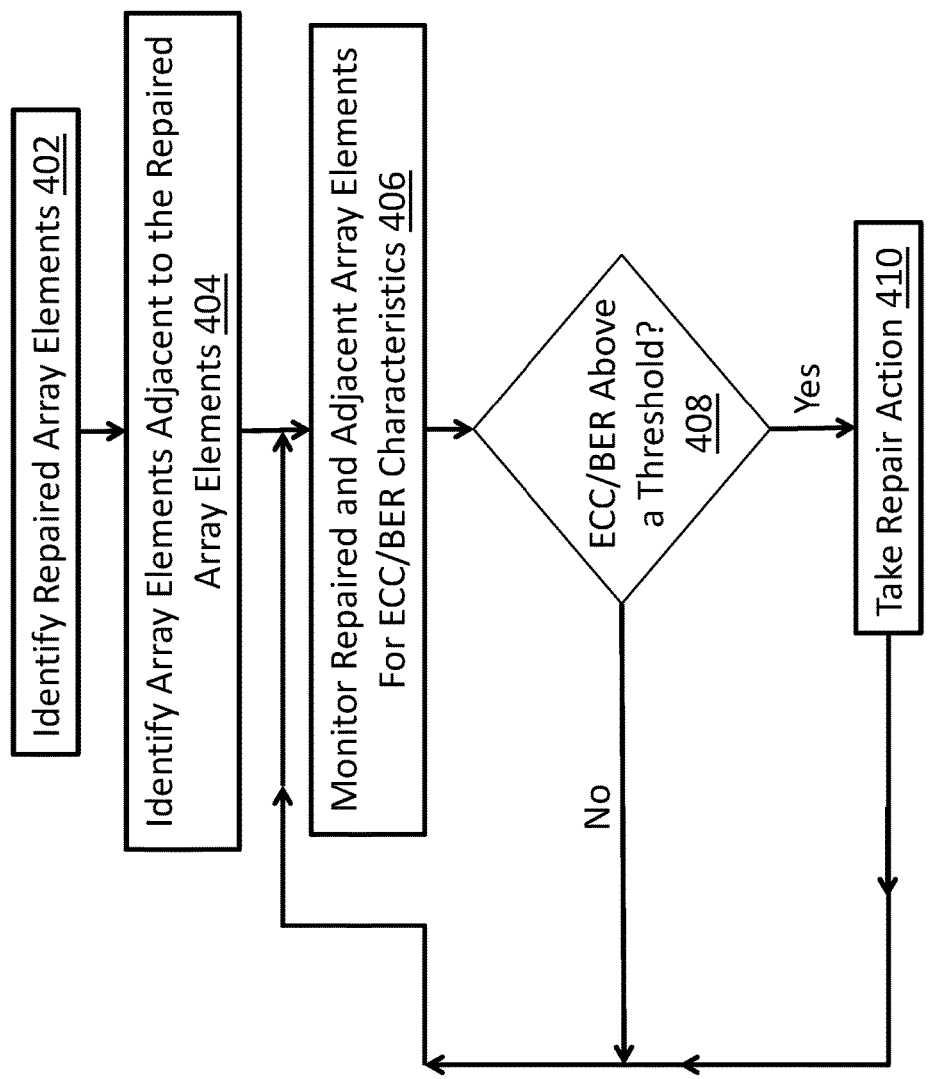
FIG. 4 is a process flow of handling repaired memory array elements in a memory of a computer system according to one or more embodiments of the invention.

Turning now to FIG. 4, a process for handling repaired array elements in a memory is generally shown in accordance with one or more embodiments. The processing shown in FIG. 4 can be performed by computer instructions located in the memory system such as ECC/BER logic 208 executing on a memory controller 204 as shown in FIG. 2. The processing shown in FIG. 4 can also be performed by the ECC/BER logic 302 executing on the memory device 306 as shown in FIG. 3. The processing shown in FIG. 4 is referred to herein as the "ECC/BER logic."

Referring now to FIG. 4, at block 402, repaired array elements in a memory array are identified. Contemporary memory devices store the physical location of repaired memory array elements and use this information to steer data requests for data at addresses of repaired array elements to a new address (e.g., at a spare row and column, in the memory array or in a spare memory array). Embodiments of the ECC/BER logic described herein can obtain the information that identifies repaired memory array elements from the memory devices at power-up time as part of the power-up process, or they may request that information from the memory device.

At block 404, memory array elements in the memory array that are adjacent to the repaired array element(s) are identified. In an embodiment, a separate group is formed for each repaired memory array element that is identified. In another embodiment, one group is formed for each repaired memory array element that is identified. In other embodiments the groups are formed based on identified repaired array elements in a group having common characteristics. As described previously, when the memory array is organized into rows and columns of memory array elements, the adjacent memory array elements are located less than a specified number of rows or a specified number of columns away (e.g., vertically, horizontally, diagonally) from the repaired memory array element. The addresses of the repaired and adjacent memory array elements can be stored in a register or other storage location that is accessible by the ECC/BER logic.

At block 406, the group(s) is monitored for error conditions. In an embodiment, the monitoring includes monitoring a number of corrections being performed during an ECC process (the number of ECC hits or BER) for the memory array elements in the group. The number of error conditions can be counted for each of the memory array elements and/or for all or a subset of the memory array elements in the group. Mechanisms to monitor array errors include, but are not limited to, ECC, cyclical redundancy check (CRC) and parity data as dictated by the memory chips design architecture. These mechanisms may be monitored by circuits on the memory chip itself or with the memory controller.

In an embodiment, such as that shown in FIG. 3, the monitoring is performed by a memory device with on die ECC without system intervention. In another embodiment, such as that shown in FIG. 2, the monitoring is performed by a memory controller.

Referring now to FIG. 4, at block 408, it is determined whether the monitoring results in detecting more than a threshold number of errors. Error thresholds may be variable depending on the sensitivity of the application. For example when high reliability is required, a low error threshold can be applied, and conversely for lower reliability, or consumer, type applications the error threshold can be increased.

In an embodiment, the threshold includes several levels, with each level being applied to at least a subset of memory array elements in the group. Each threshold level can correspond to a different repair action. Repair levels include, but are not limited to: repairing only the array address which exceeds the repair threshold; repairing the array address which exceeds the repair threshold and a subset of physically adjacent array addresses; and/or repairing the array address which exceeds the repair threshold and all of the physically adjacent array addresses.

Based on determining, at block 408, that more than a threshold number of errors have not been detected, processing continues at block 406 with monitoring the group(s) for error conditions.

Based on determining, at block 408, that more than a threshold number of errors have been detected, the process continues at block 410. At block 410, a repair action is performed. As described previously, the repair action can include, but is not limited to a field repair; sparing out the memory chip and setting a flag for a FRU call; and marking the memory array element(s).

Once the repair action(s) is completed at block 410, the process continues at block 406 with monitoring the group(s) for error conditions.

Technical effects and benefits can include improving memory array reliability by proactively monitoring and repairing cells adjacent to previously repaired cells before they become uncorrectable errors. Technical effects and benefits can also include avoiding charge margin sharing and reducing leakage for defects which span multiple cells.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for handling repaired array elements in a memory of a computer system, the method comprising:
   identifying a repaired memory array element in a memory array;
   identifying memory array elements in the memory array that are adjacent to the repaired memory array element;
   forming a group that includes the repaired and adjacent memory array elements;
   monitoring the group for error conditions;
   determining whether a number of the error conditions exceeds a threshold, wherein the threshold includes a plurality of levels, each level applied to at least a subset of memory array elements in the group, each level corresponding to a different repair action; and
   initiating a repair action to the memory array based on determining that the number of error conditions exceeds the threshold, wherein the repair action is selected from the group consisting of replacing a memory array element with a spare memory array element, replacing the memory array with a spare memory array, and marking the memory array as unusable.

2. The method of claim 1, wherein the group specifies physical addresses of the repaired and adjacent memory array elements.

3. The method of claim 1, wherein the memory array is organized into rows and columns of memory array elements and the adjacent memory array elements are located less than a specified number of rows or a specified number of columns away from the repaired memory array element.

4. The method of claim 1, wherein the memory array is organized into rows and columns of memory array elements and the adjacent memory array elements are located less than two rows or two columns away from the repaired memory array element.

5. The method of claim 1, wherein the monitoring and determining are performed by logic located on a memory controller.

6. The method of claim 1, wherein the monitoring and determining are performed by logic located on the memory.

7. The method of claim 1, wherein the error condition is a bit error rate (BER).

8. The method of claim 1, wherein the monitoring includes monitoring error-correcting code (ECC) hits.

9. A memory system comprising:
   a memory array, the memory system configured to:
      identify a repaired memory array element in the memory array;
      identify memory array elements in the memory array that are adjacent to the repaired memory array element;
      form a group that includes the repaired and adjacent memory array elements;
      monitor the group for error conditions;

determine whether a number of the error conditions exceeds a threshold wherein the threshold includes a plurality of levels, each level applied to at least a subset of memory array elements in the group, each level corresponding to a different repair action; and initiate a repair action to the memory array based on determining that the number of error conditions exceeds the threshold, wherein the repair action is selected from the group consisting of replacing a memory array element with a spare memory array element, replacing the memory array with a spare memory array, and marking the memory array as unusable.

10. The memory system of claim 9, wherein the group specifies physical addresses of the repaired and adjacent memory array elements.

11. The memory system of claim 9, wherein the memory array is organized into rows and columns of memory array elements and the adjacent memory array elements are located less than a specified number of rows or a specified number of columns away from the repaired memory array element.

12. The memory system of claim 9, further comprising a memory controller, wherein the monitoring and determining are performed by logic located on the memory controller.

13. The memory system of claim 9, further comprising a memory that includes the memory array, wherein the monitoring and determining are performed by logic located on the memory.

14. The memory system of claim 9, wherein the error condition is a bit error rate (BER).

15. The memory system of claim 9, wherein the monitoring includes monitoring error-correcting code (ECC) hits.

16. A non-transitory computer storage medium for handling repaired array elements in a memory of a computer system, the non-transitory computer storage medium comprising a computer readable storage medium having program instructions embodied therewith, the program instructions executable by processing circuitry to cause the processing circuitry to:

identify a repaired memory array element in the memory array;

identify memory array elements in the memory array that are adjacent to the repaired memory array element;

form a group that includes the repaired and adjacent memory array elements; monitor the group for error conditions;

determine whether a number of the error conditions exceeds a threshold, wherein the threshold includes a plurality of levels, each level applied to at least a subset of memory array elements in the group, each level corresponding to a different repair action; and initiate a repair action to the memory array based on determining that the number of error conditions exceeds the threshold, wherein the repair action is selected from the group consisting of replacing a memory array element with a spare memory array element, replacing the memory array with a spare memory array, and marking the memory array as unusable.

17. The computer program product of claim 16, wherein the memory array is organized into rows and columns of memory array elements and the adjacent memory array elements are located less than a specified number of rows or a specified number of columns away from the repaired memory array element.

18. The computer program product of claim 16, wherein the error condition is a bit error rate (BER).

* * * * *